(12) United States Patent  (10) Patent No.: US 6,396,141 B2
Schueller et al.  (45) Date of Patent: May 28, 2002

(54) TAPE BALL GRID ARRAY WITH INTERCONNECTED GROUND PLANE

(75) Inventors: Randolph D. Schueller, Austin; Donald K. Larson, Cedar Park, both of TX (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/754,482

(22) Filed: Jan. 4, 2001

Related U.S. Application Data

(62) Division of application No. 09/172,515, filed on Oct. 14, 1998.

(51) Int. Cl.⁷ .............................................. H01L 23/10
(52) U.S. Cl. ....................... 257/706; 257/707; 257/738; 257/780; 257/784; 257/698; 257/778; 257/774; 257/701; 257/668; 361/704; 361/707; 361/711
(58) Field of Search ................................ 257/707, 706, 257/738, 778, 698, 701, 774, 780, 668, 784; 361/704, 707, 711

(56) References Cited

U.S. PATENT DOCUMENTS 5,376,588 A  12/1994  Pendse ........................ 437/211
5,397,921 A  3/1995  Karnezos .................... 257/779
5,409,865 A  4/1995  Karnezos .................... 437/210
5,435,732 A  7/1995  Angulas et al. ................ 439/67
5,519,936 A  5/1996  Andros et al. ................. 29/840
5,561,323 A  10/1996  Andros et al. .............. 257/707
5,583,378 A  12/1996  Marrs et al. ................. 257/710
5,585,162 A  12/1996  Schueller .................... 428/131
5,844,168 A  * 12/1998  Schueller et al. .......... 174/52.4
5,895,967 A  * 4/1999  Stearns et al. .............. 257/691
6,011,694 A  1/2000  Hirakawa ................... 361/774

FOREIGN PATENT DOCUMENTS

JP          401119098 A  *  5/1989
WO         WO 98/25301      6/1998
WO         WO 98/25303      6/1998

* cited by examiner

Primary Examiner—Steven Loke
Assistant Examiner—Luan Thai
(74) Attorney, Agent, or Firm—Darla P. Fonseca

(57) ABSTRACT

A flexible circuit system includes a flexible dielectric layer having a first conductive layer on a first side and a second conductive layer on a second side. A non-conductive, closed end passage extends through the dielectric layer from the first side to the second side. The first conductive layer is adjacent an open end of the passage at the first side, and the second conductive layer forms the closed end of the passage at the second side. A stiffener member is attached to the second conductive layer. A solder ball is connected to provide a conductive path between the first conductive layer and the second conductive layer.

3 Claims, 3 Drawing Sheets

US 6,396,141 B2

TAPE BALL GRID ARRAY WITH INTERCONNECTED GROUND PLANE

This is a divisional of Application Ser. No. 09/172,515 filed Oct. 14, 1998.

BACKGROUND

The disclosures herein relate generally to a tape ball grid array (TBGA) and more particularly to a TBGA computer chip package in which interconnection to a ground plane on the tape is made with solder balls.

Tape ball grid array (TBGA) packages offer many of the same advantages as plastic BGAS, namely, excellent durability, improved board space utilization, and ease of surface mount assembly along with the associated yield improvements. TBGA packages go a step further, however, and offer the added benefits of improved signal integrity, better heat dissipation, and extendibility to higher pin counts. To achieve the maximum noise reduction in high speed devices it is necessary for TBGA packages to incorporate an additional metal layer which acts as a ground plane. This extra metal layer is achieved by either using conventional two metal flex circuitry or to electrically connect the stiffener itself.

Two metal flex circuitry in the industry is made by either plating or laminating a thin layer of metal (usually copper) on both sides of a thin polymer film and then interconnecting the two sides with a metallized via. The vias are typically made with either punching, laser milling or chemical etching. These vias are then metallized by first depositing (sputtering or electroless plating) a seed layer of metal into the vias followed by plating up of these vias. In all cases the extra steps of depositing this seed layer and then plating up these vias is time consuming and costly.

There have been various attempts at making electrical interconnection to a ground plane on the tape. One such attempt includes U.S. Pat. No. 5,583,378 which discloses a ball grid array package and method for manufacture of the same. The ball grid array package includes a thermal conductor which is a linearly co-extensive outer layer in an interconnection substrate and forms the outer surface of the ball grid array package. An integrated circuit chip is positioned on the underside of the package in a well region. The well region is either formed directly in the interconnection substrate or is formed by the application of a dam. The well region is then filled with an insulating encapsulant material to a predetermined level. In this device, plated through holes interconnect layers in a ball grid array.

U.S. Pat. No. 5,519,936 and U.S. Pat. No. 5,561,323 each disclose an electronic package which includes a rigid support member, e.g., copper sheet, to which is bonded both the package's semiconductor chip and circuitized substrate members. The chip is bonded using a thermally conductive adhesive while the circuitized substrate, preferably a flexible circuit, is bonded using an electrically insulative adhesive. The chip is electrically coupled to designated parts of the circuitry of the substrate, preferably by wire, thermocompression or thermosonic bonding. An encapsulant may be used to cover and protect the connections between the chip and substrate. This package may in turn be electrically coupled to a separate second substrate such as a PCB.

U.S. Pat. No. 5,435,732 discloses a flexible circuit member including a circuitized substrate of a dielectric material having a plurality of apertures therein. Located within and/or bridging selected ones of the apertures are electrical conductors, the conductors having a solder member secured thereto. A frame is also used, the circuitized substrate being secured thereto. Each of these devices disclose metallized through holes used to interconnect layers on a TBGA.

U.S. Pat. No. 5,585,162 discloses a flexible circuit construction which allows solder balls to be mass reflow attached to the ground plane of a double-sided flexible circuit by providing a first via which is separate from the remainder of the ground plane, but which is electrically connected to the ground plane through a second via at a distance from the first via by a circuit trace on the side of the flexible circuit opposite the ground plane. In this device, metallized through holes or metallized blind vias interconnect layers on the TBGA.

U.S. Pat. No. 5,397,921 and U.S. Pat. No. 5,409,865 disclose a device and a method in which an integrated circuit package, including a TAB tape, a stiffener structure, and solder balls, provide external connection to a semiconductor die connected through electrically conductive traces of the TAB tape. The TAB tape has upper and lower dielectric layers each having an aperture for accommodating the semiconductor die. In addition, the lower dielectric layer is provided with an array of openings which is coincident with an array of electrically conductive pads in the TAB tape, so as to allow the solder balls to attach to the conductive pads. The semiconductor die can be connected to the TAB tape either by inner lead bonding, or by wire bonding. In these devices, solder balls make contact with a stiffener on a TBGA.

U.S. Pat. No. 5,376,588 discloses a surface mount package in which a flexible circuit is laminated on a conductive body. The flexible circuit includes a wiring pattern which is connected to signal bonding pads of an integrated circuit die housed within the package. The flexible circuit may, for example, be a TAB frame or a printed circuit board. Ground bonding pads of the integrated circuit die are coupled to the conductive body via a ground bar or a wire-bondable finish on the conductive body. In this device, a conductive adhesive makes contact with a stiffener on a TBGA.

Therefore, as the speed requirements for computer chips rises above 200 MHz, what is needed is a TBGA package which contains an electrically coupled ground plane to minimize the electrical noise in the system, and which does not require the use of metallized vias.

SUMMARY

One embodiment, accordingly, provides an apparatus and a method for producing a two-metal flex circuit which eliminates the use of metallized vias to interconnect one side of the circuit to the other side thereof. To this end, an electronic package comprises a flexible dielectric layer having a first conductive layer on a first side and a second conductive layer on a second side. A non-conductive passage extends through the dielectric layer from the first side to the second side. The first conductive layer is adjacent an open end of the passage at the first side, and the second conductive layer forms a closed end of the passage at the second side. A solder ball is connected to provide a conductive path between the first conductive layer and the second conductive layer.

A principal advantage of this embodiment is that it provides a very low cost two metal flex circuit. The low cost factor is primarily due to the elimination of metallized vias which interconnect one conductive side of the flex circuit to the other side. Solder balls are used to complete the connection making the necessary contact with the ground plane.

BRIEF DESCRIPTION OF THE DRAWING FIGURES

DETAILED DESCRIPTION

Figure 1:
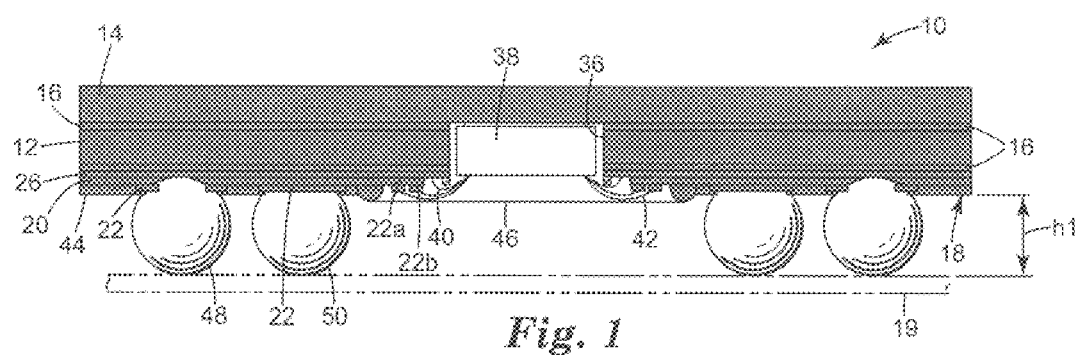
FIG. 1 is a diagrammatic view illustrating an embodiment of an electronic package.

In accordance with FIG. 1, a first stiffener member 12 is bonded to a second stiffener member 14 bv a commercially available adhesive 16. Stiffener members 12 and 14 are commonly formed of copper material and function to dissipate heat and add support to an electronic package 10 including a flexible circuit, generally designated 18. The support provided by stiffener members 12 and 14 enhances planarity for solder ball attachment to a printed circuit board 19, discussed below.

Figure 3:
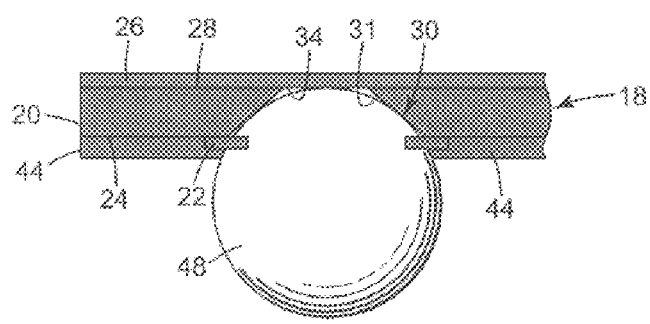
FIG. 3 is a diagrammatic view illustrating an embodiment of a solder ball seated in a passage of a flexible circuit.

The flexible circuit 18, FIGS. 1 and 3, includes a flexible dielectric layer 20 having a first conductive layer 22 on a first side 24, and a second conductive layer 26 on a second side 28, opposite the first side 24. A passage or via 30 extends through the flexible dielectric layer 20 from first side 24 to second side 28. Passage 30 is nonconductive due to the absence of metallized sidewalls used in known applications. As such, the passage 30 is not capable of conducting a signal between first side 24 and second side 28.

Passage 30 includes tapered sidewalls 31 formed in the flexible dielectric layer 20 by a suitable etching process, preferably a well known wet etching process. Passage 30 could also be formed by a laser ablation process, a dry etching process such as plasma etching, or by laser drilling. The first conductive layer 22 is patterned by a suitable well known process and typically forms signal and power traces 22a, 22b. First layer 22 is adjacent an open end 32 of passage 30 at first side 24. The second conductive layer 26, however, functions as a ground or power reference plane having a constant voltage, and covers second side 28 so as to form a closed end 34 of passage 30.

The first stiffener member 12, FIG. 1, is attached to the flexible circuit 18 by the adhesive 16, mentioned above. An opening in the form of a throughbore 36, is formed through first stiffener member 12. A semiconductor device 38 is mounted on second stiffener member 14 by a suitable means such as a suitable conventional adhesive. Semiconductor device 38 protrudes into throughbore 36 and is wirebonded at 40 directly to second conductive layer 26 and is similarly wirebonded at 42 to first conductive layer 22. A cover coat 44 may be provided on first conductive layer 22 to prevent a tendency for solder to wick over from one trace 22a to adjacent trace 22b. Also, an encapsulant 46 may be provided to encapsulate semiconductor device 38 and the wirebond connections 40 and 42.

Figure 1A:
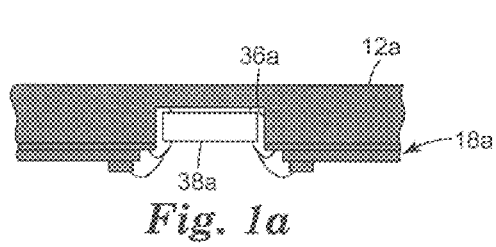
FIG. 1a is a diagrammatic View illustrating an embodiment of a semiconductor device seated in a stiffener member.

As an alternative, FIG. 1a, instead of a two-piece stiffener as described above, a single stiffener 12a could be provided with a cavity 36a formed therein near the center thereof, and a semiconductor device 38a could be placed in the cavity and connected to a circuit 18a.

A first solder ball 48, FIGS. 1 and 3, may seat in passage 30. As such, solder ball 48 seats in passage 30 in such a way as to engage both the first conductive layer 22 at open end 32, and the second conductive layer 26 at closed end 34. In this manner, solder ball 48 provides a conductive path between the first conductive layer 22 and the second conductive layer 26. A second solder ball 50, is reflow attached directly to a pad region of the first conductive layer 22 and does not make electrical contact with the second conductive layer 26.

Figure 1B:
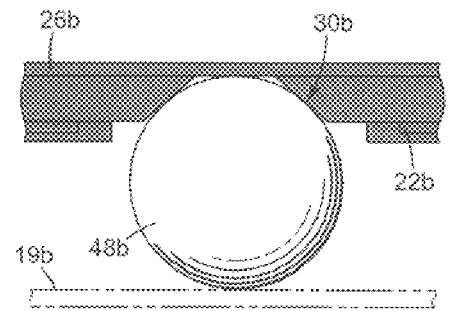
FIG. 1b is a diagrammatic view illustrating an embodiment of a solder ball seated in a passage of a flexible circuit.

Alternatively, a solder ball 48b, FIG. 1b, is seated in passage 30b and is reflow attached directly to a second conductive layer 26b without making any contact with the first conductive layer 22b. As such, an electrical contact is provided between a printed circuit board 19b and second conductive layer 26b.

Figure 2:
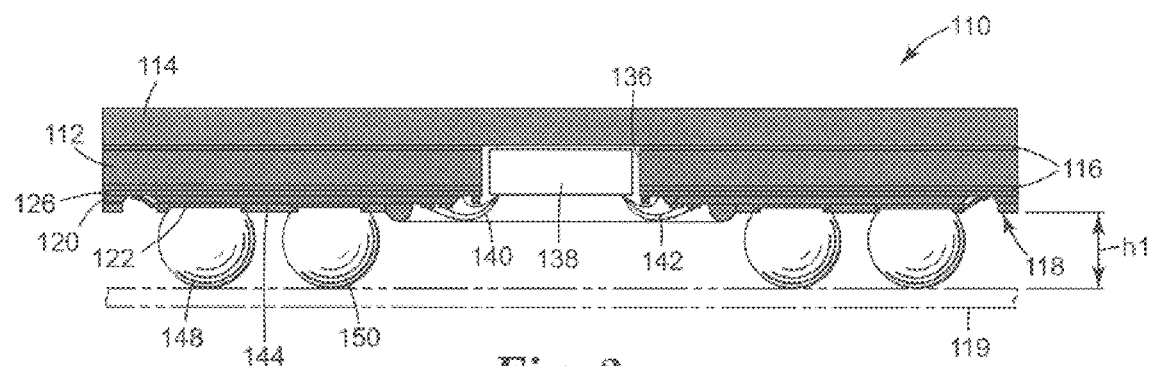
FIG. 2 is a diagrammatic view illustrating another embodiment of an electronic package.

In FIG. 2, an alternative embodiment is illustrated. A first stiffener member 112 is bonded to a second stiffener member 114 by a commercially available adhesive 116. Stiffener members 112 and 114 are formed of copper material to dissipate heat and provide support to an electronic package 110 including a flexible circuit 118. The support provided by stiffener members 112 and 114 enhances planarity for solder ball attachment to a printed circuit board 119, discussed below.

Figure 4:
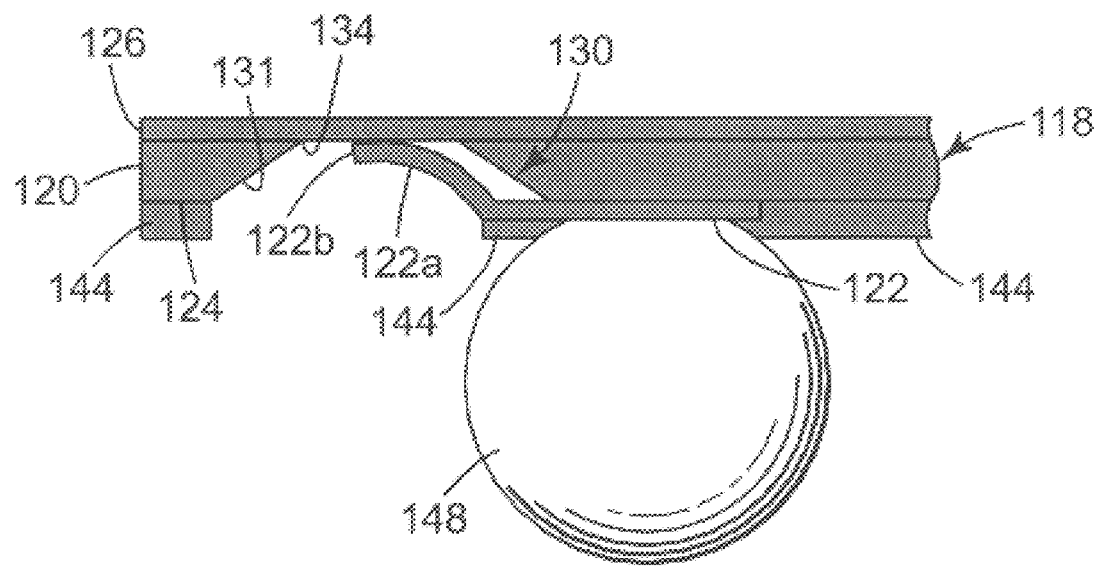
FIG. 4 is a diagrammatic view illustrating an embodiment of a solder ball seated adjacent a passage of a flexible circuit, and a lead extending through the passage.

The flexible circuit 118, FIGS. 2 and 4 includes a flexible dielectric layer 120 having a first conductive layer 122 on a first side 124, and a second conductive layer 126 on a second side 128, opposite the first side 124. A passage or via 130 extends through the flexible dielectric layer 120 from side 124 to side 128. Passage 130 is non-conductive due to the absence of metallized sidewalls. As such, the passage 130 is not capable of conducting a signal between first side 124 and second side 128.

Passage 130 includes tapered walls 131 formed in the flexible dielectric layer 120 by the etching process described above. The first conductive layer 122 is patterned as described above, and typically forms signal and power traces. First layer 122 is adjacent an open end 132 of passage 130 at first side 124. The second conductive layer 126, however functions as a ground or power reference plane having a constant voltage, and covers second side 128 so as to form a closed end 134 of passage 130.

The first stiffener member 112, FIG. 2, is attached to the flexible circuit 118 by the adhesive 116, mentioned above. An opening in the form of a throughbore 136, is formed through first stiffener member 112. A semiconductor device 138 is mounted on second stiffener member 114 as described above. Semiconductor device 138 protrudes into throughbore 136 and is wirebonded at 140 directly to second conductive layer 126 and is similarly wirebonded at 142 to first conductive layer 122. A cover coat 144 may be provided on first conductive layer 122 to limit a tendency for one trace to wick over to an adjacent trace. Also, an encapsulant 46 may be provided to encapsulate semiconductor device 138 and the wirebond connections 140 and 142.

A first solder ball 148, FIGS. 2 and 4, may seat adjacent passage 130. As such, solder ball 148 seats on first conductive layer 122 adjacent open end 132. A conductive lead 122a extends from the first conductive layer 122, through the passage 130, and terminates at an end 122b in electrical contact with second conductive layer 126. The lead 122a may be attached to the second conductive layer by means such as ultrasonic welding, thermal-compression bonding or other known methods. A second solder ball 150, is reflow attached directly to a pad region of the first layer 122 and does not make electrical contact with the second conductive layer 126.

In operation, the embodiments described herein provide a TBGA package having a multi-metal layer construction. One metal layer serves as a reference layer and an adjacent layer serves as a signal layer. These adjacent layers act to reduce noise in high-speed packaging applications.

A flexible dielectric layer includes a first conductive layer on a first side and a second conductive layer on a second side. The first conductive layer includes a signal trace electrically insulated from the second conductive layer. A stiffening member may be attached to the second conductive layer. A passage extends through the dielectric layer from the first side of the dielectric layer whereby the second conductive layer is exposed within the passage. One aspect of these embodiments is that only the first conductive layer is patterned to include signal traces. Limiting such patterning to only one conductive layer contributes to maximizing the overlying areas of both conductive layers.

As a result, one embodiment provides an electronic package including a flexible dielectric layer having a first conductive layer on a first side and a second conductive layer on a second side. A non-conductive passage extends through the dielectric layer from the first side to the second side. The first conductive layer is adjacent an open end of the passage at the first side and the second conductive layer forms a closed end of the passage at the second side. A solder ball is connected to provide a conductive path between the first conductive layer and the second conductive layer.

Another embodiment provides a flexible circuit including a flexible dielectric layer having a first conductive layer on a first side and a second conductive layer on a second side. A non-conductive passage extends through the dielectric layer from the first side to the second side. The first conductive layer is adjacent an open end of the passage at the first side, and the second conductive layer forms a closed end of the passage at the second side. A stiffener member is attached to the second conductive layer. A solder ball is connected to the first conductive layer and to the second conductive layer.

Another embodiment provides a low-profile flexible circuit package including a flexible dielectric layer having a first conductive layer on a first side and a second conductive layer on a second side. A closed end, non-conductive passage extends through the dielectric layer from the first side to the second side. The first conductive layer is adjacent an open end of the passage at the first side, and the second conductive layer forms the closed end of the passage at the second side. A first stiffener member is attached to the second conductive layer and includes a throughbore. A second stiffener member is attached to the first stiffener member and has a semiconductor device mounted thereon and extending into the throughbore. A solder ball is connected to the first conductive layer and to the second conductive layer.

Another embodiment discloses a method of providing a low-profile, flexible circuit package. A first stiffener member having an opening formed therein is connected to a second stiffener member which includes a semiconductor device protruding into the opening. A flexible dielectric layer is attached to the first stiffener member and includes a first conductive layer on a first side and a second conductive layer on a second side. The second conductive layer is engaged with the first stiffener member. A non-conductive passage is formed through the dielectric layer from the first side to the second side, so that the first conductive layer is adjacent an open end of the passage at the first side, and the second conductive layer forms a closed end of the passage at the second side. A solder ball is connected to the first conductive layer and to the second conductive layer. The solder ball may be seated in the passage for providing a conductive path between the first and second conductive layers. Alternatively, the solder ball may be engaged with the first conductive layer and a conductive lead may be extended from the first conductive layer and through the passage to terminate at an end in contact with the second conductive layer.

Another embodiment provides an electronic package including a thin dielectric layer having a patterned first conductive layer on one side and a second conductive layer on an opposite side. A non-conductive passage extends through the dielectric layer from the one side to the opposite side which forms a closed end of the passage. A conductive material is deposited in the passage in contact with the second conductive layer. A stiffener member is attached to the second conductive layer using an adhesive material, and a semiconductor is electrically connected to the conductive layers.

A further electronic package embodiment provides a patterned trace on the first conductive layer bonded through the non-conductive passage to the second conductive layer. The trace is connected to a pad positioned in the first conductive layer on which a solder ball is attached.

A further method embodiment provides a low-profile circuit package including a flexible dielectric layer having a patterned first conductive layer on one side and a second conductive layer on an opposite side. At least one non-conductive passage is formed in the dielectric layer and the second conductive layer forms a closed end of the passage. A stiffener member is attached to the opposite side by means of an adhesive material. A semiconductor is attached in a cavity in the stiffener member and is electrically connected to the first and second conductive layers. A solder ball is placed in each passage and is heated to a temperature sufficient to melt the solder ball and attach it to the second conductive layer.

A further electronic package embodiment provides a dielectric layer having a patterned first conductive layer on a first side and a second conductive layer on a second side. The first conductive layer includes a pad region. A non-conductive passage extends through the dielectric layer forming a closed end of the passage at the second side. A first solder ball is mounted in the passage to provide electrical connection with the second conductive layer. A second adjacent solder ball is mounted on the pad region to provide electrical connection with the first conductive layer. The first solder ball is mounted to provide a stand-off height that is substantially the same as the adjacent second solder ball.

As it can be seen, the principal advantages of these embodiments are that a substantially simplified, two-metal flexible circuit can be used to create a high performance semiconductor package. Presently known two-metal flexible circuits with conductive vias are used to electrically interconnect the two opposed conductive layers, i.e. the vias have conductive sidewalls. These conventional two-metal flexible circuits are expensive due to the many specialized processes required to create the metallized vias. In addition, the metallized vias add unwanted electrical inductance. The embodiments disclosed herein provide for a package with superior electrical performance at significantly lower costs.

Figure 5:
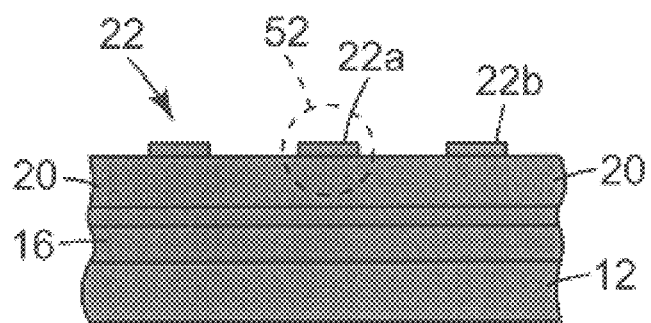
FIG. 5 is a diagrammatic view illustrating an embodiment of adjacent traces and an associated EMI field.

In addition to lower cost, another benefit of packages according to the present embodiments is that the second conductive layer 26, FIG. 5, may serve as a ground plane for reducing crosstalk associated with EMI fields 52, only one of which is illustrated, from one trace 22a to adjacent trace 22b. Crosstalk is a voltage associated with one trace 22b induced by the EMI field 52 on the adjacent trace 22a. The radius of the field 52 is approximately equal to the distance from the first conductive layer 22 to the second conductive layer 26. The closer the second conductive layer 26 is to the first conductive layer 22, the closer the traces 22a and 22b can be to each other without inducing crosstalk. As discussed above, second conductive layer 26 is bonded to stiffener member 12 by the adhesive 16.

Unlike prior devices, package constructions according to the present embodiments provide a consistent distance between the second conductive layer 26 and the first conductive layer 22. Furthermore, as the second conductive layer 26 is immediately adjacent the dielectric layer 20, the distance between the two conductive layers 22 and 26 is minimized for a dielectric layer 20 of a given thickness. A reliable and predictable distance between the two conductive layers 22 and 26 is achieved due to the consistent and predictable thickness of the dielectric layer 20.

The issue of planarity concerns a standoff height, designated $h_1$, in FIGS. 1 and 2. The height $h_1$, is to be the height at which the solder balls extend from the flexible circuit to a contact plane with the printed circuit board. It is desirable to control the height $h_1$, such that whether a solder ball seats in a passage or seats on the first conductive layer, the standoff height $h_1$, remains substantially constant. There are several methods to achieve this. For example, a small amount of conductive material may be used to fill the passage up to the level of the first conductive layer, thus, establishing a plane for the use of the same size solder balls on the flexible circuit. Another method could include providing the passage having a diameter smaller then the diameter of the opening in the first conductive layer for the usage of same size solder balls. A further method could include using larger diameter solder balls in the passages and smaller diameter solder balls seated on the first conductive layer.

In the embodiment of FIGS. 2 and 4, the package will enable the user to create uniquely addressed circuit configurations by interconnecting only a specific set of traces to the ground plane. This will allow for one circuit design to be used for several different semiconductors. The package allows solder balls to be mass reflow attached to the ground plane of a two metal layer flexible circuit. Non-metallized passages through the dielectric layer facilitate making interconnection between the ground plane and the trace layer on the opposing side of the dielectric layer. The solder balls may be attached directly to the ground plane through the passages. Alternatively, a lead may extend from the trace layer adjacent the solder ball, through the passage, and into contact with the ground plane.

Although illustrative embodiments have been shown and described, a wide range of modifications, change and substitution is contemplated in the foregoing disclosure and in some instances, some features of the embodiments may be employed without a corresponding use of other features. Accordingly, it is appropriate that the appended claims be construed broadly and in a manner consistent with the scope of the embodiments disclosed herein.

What is claimed is:

1. An electronic package comprising:

a flexible dielectric layer having a first conductive layer on a first side thereof and a second conductive layer on a second side thereof, opposite the first side;

a non-conductive passage extending through the dielectric layer from the first side to the second side, the first conductive layer being adjacent an open end of the passage at the first side, and the second conductive layer forming a closed end of the passage at the second side; and a solder ball, wherein the solder ball is engaged with the first conductive layer, and a conductive lead extends from the first conductive layer through the passage and terminates at an end in contact with the second conductive layer.

2. A flexible circuit system comprising:

a flexible dielectric layer having a first conductive layer on a first side thereof and a second conductive layer on a second side thereof, opposite the first side;

a non-conductive passage extending through the dielectric layer from the first side to the second side, the first conductive layer being adjacent an open end of the passage at the first side, and the second conductive layer forming a closed end of the passage at the second side;

a stiffener member attached to the second conductive layer; and a solder ball electrically connected to the first conductive layer and to the second conductive layer, wherein the solder ball is engaged with the first conductive layer, and a conductive lead extends from the first conductive layer through the passage and terminates at an end in contact with the second conductive layer.

3. A low-profile, flexible circuit package comprising:

a flexible dielectric layer having a first conductive layer on a first side thereof and a second conductive layer on a second side thereof, opposite the first side;

a closed end, non-conductive passage extending through the dielectric layer from the first side to the second side, the first conductive layer being adjacent an open end of the passage at the first side, and the second conductive layer forming the closed end of the passage at the second side;

a first stiffener member attached to the second conductive layer and including a throughbore formed therein;

a second stiffener member attached to the first stiffener member and having a semiconductor device mounted thereon and extending into the throughbore;

and a solder ball electrically connected to the first conductive layer and to the second conductive layer, wherein the solder ball is engaged with the first conductive layer, and a conductive lead extends from the first conductive layer through the passage and terminates at an end in contact with the second conductive layer.

* * * * *